United States Patent [19]

Spaderna et al.

[11] Patent Number: 4,875,196

[45] Date of Patent: Oct. 17, 1989

[54] METHOD OF OPERATING DATA BUFFER APPARATUS

[75] Inventors: Dieter W. Spaderna, Aloha, Oreg.; Jeffrey L. Miller, Vancouver, Wash.

[73] Assignee: Sharp Microelectronic Technology, Inc., Vancouver, Wash.

[21] Appl. No.: 93,969

[22] Filed: Sep. 8, 1987

[51] Int. Cl.[4] .......................... G11C 8/00; G11C 7/00
[52] U.S. Cl. ............................... 365/238; 365/189.04; 365/230.04; 365/78; 365/221
[58] Field of Search ................. 365/78, 221, 236, 239, 365/230, 189, 203, 189.04, 230.04

[56] References Cited

U.S. PATENT DOCUMENTS

| | | | |
|---|---|---|---|
| 4,347,587 | 8/1982 | Rao | 365/221 |
| 4,433,394 | 2/1984 | Torii et al. | 365/221 X |
| 4,636,983 | 1/1987 | Young et al. | 365/181 |
| 4,678,940 | 7/1987 | Goddard et al. | 307/446 |
| 4,730,279 | 3/1988 | Ohtani | 365/203 X |
| 4,754,433 | 6/1988 | Chin et al. | 365/203 |
| 4,758,987 | 7/1988 | Sakui | 365/203 |

OTHER PUBLICATIONS

Electronic Design Report, Jun. 11, 1987, "Rich with Logic, Memory ICs Have Their Specialties", pp. 77–86.
System Design/Memory Systems, Computer Design, Aug. 1, 1986, by Tom Pai, pp. 109–112.
Memory based CMOS FIFO buffors sport large capacities, etc. EDN Magazine; Mar. 18, 1987, pp. 65–74.
FIFOs Rubber-Band Memories to Hold Your System Together, Monolithic Memories, Publication, pp. 8–6 to 8–10.
Asynchronous FIFO's Require Special Attention, 1985 IEEE International Test Conference, paper 13.2, pp. 445–450.
Understanding FIFOs, Cypress Semiconductor Co. Publication, pp. 6–23 to 6–34.
CMOS Parallel First–In/First–Out FIFO, Integrated Device Technology, Inc., Jul. 1986 Data Sheet.
CMOS Parallel–Serial FIFO; Integrated Device Technology, Inc. Publication, Oct. 1986, pp. 1–27.

Primary Examiner—Stuart N. Hecker
Assistant Examiner—Alfonso Garcia
Attorney, Agent, or Firm—A. C. Smith

[57] ABSTRACT

An improved First-In, First-Out data buffer and method of operation incorporates a plurality of arrays of random-access memory cells in column and row orientation per array in which all the cells in a row of one array are precharged simultaneously as memory cells are accessed for read or write operations in another array. Also, all the cells in a row of the other array may be precharged as the memory cells in the one array are accessed independently for read or write operations. Accesses to memory cells in addressed rows alternate from one array to another so that the signal conditioning of the memory cells in one array can take place before access in needed and while memory cells are being accessed in another array. Improved status logic unambigously designates the conditions of empty, half full and full, independent of the sequence of data read and write operations. Data signal driver circuitry controls the rate of change of data output signals for improved noise performance and compatibility with external circuitry.

4 Claims, 7 Drawing Sheets

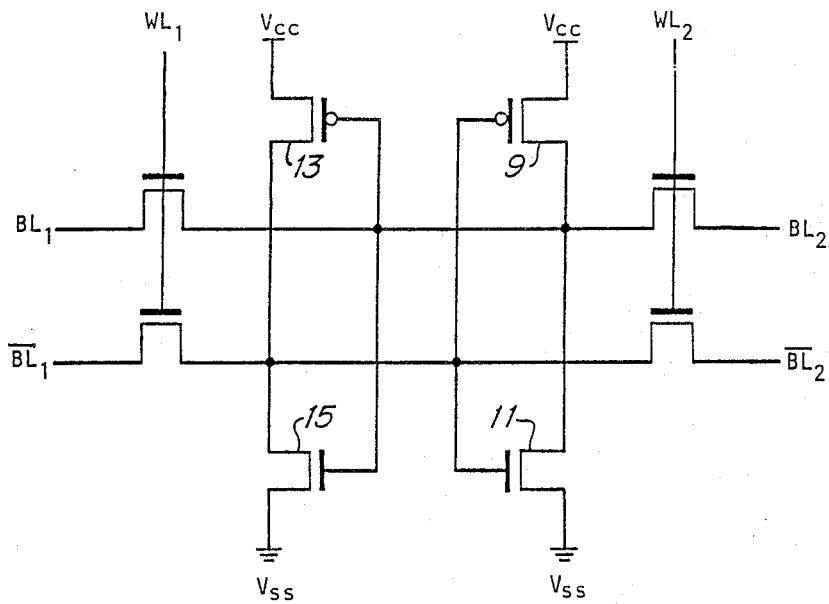
Figure 1A
| FIGURE 2A |
|---|
| FIGURE 2B |
Figure 2
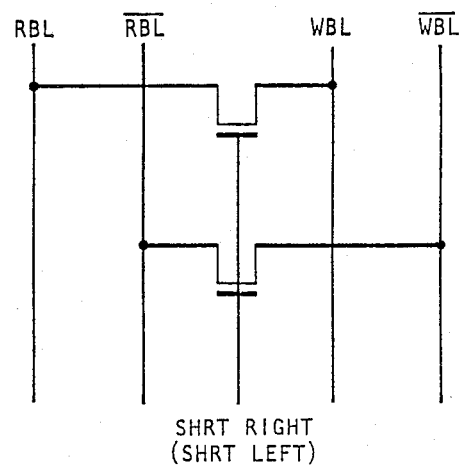
Figure 1B

METHOD OF OPERATING DATA BUFFER APPARATUS

BACKGROUND OF THE INVENTION

Field of Invention

This invention relates to data buffers of the type referred to as First-In, First-Out (FIFO) buffer memories; and more particularly to such buffers in which input and output data read and write operations are independent and asynchronously operated.

Many commercially-available data buffers are configured using dual-port memory cells in a random-access array with asynchronous read and write capabilities per cell. The configuration of such cells within a Random Access Memory structure (RAM) requires addressing schemes including pointers that indicate the location to be written into and the location to be read from in sequential order. Such RAM FIFO buffers also require one or more a test or flat bits to designate which written words in memory have not yet been read out. Also, the status of pointers has to be detected to assure that data can only be written into empty memory locations, and that data can only be read out from occupied memory locations.

Conventional FIFO buffers usually designate the status of the FIFO buffer as being full or empty or partially full in order to help resolve ambiguities in detected pointer conditions, and usually also include comparators and control logic to prevent over-run or under-run conditions as data is written in and read out.

Conventional FIFO buffers may be expanded in data word length and in number of words stored by cascading several similar circuits and by using 'handshaking' control techniques that transfer from one circuit to the next in the cascaded array. These expansions commonly introduce undesirable delays in the time required to access stored data, and generally contribute to the complexity of the required control logic.

SUMMARY OF THE INVENTION

In accordance with the present invention, at least a pair of random-access memory arrays are operated in a dual addressable configuration which permits accessing of data, for example for writing in one array while data is being read from the other array. In addition, preparation for future accesses in each array can begin one or more operating cycles in advance so that the various operating intervals normally required during a memory access cycle always occur in the previous cycle, or cycles. Specifically, by precharging the bit lines of one array while the other array is being accessed, then, upon switching from one location to the next in such other array, data can be read immediately since the precharging of the bit lines in such other array was accomplished during the previous interval while data was being accessed from the one array. Consecutive addresses are mapped sequentially be columns, so repeated reading or writing effectively marches along the row until the array boundary is reached. The word line remains HIGH while this 'marching' along occurs, so data access is very rapid. In addition, the pointers used to designate the sequential memory locations in the RAM into which data is written and from which data is read, incorporate a selected numbering scheme which eliminates ambiguities in the full/empty status designation of the arrays. The access time to read data previously written is greatly reduced, essentially to the limits of speed with which the pointers can be updated. Further, data output driver circuits are temperature and voltage stabilized and conditioned to minimize switching noise for a given rise-time characteristic.

DESCRIPTION OF THE DRAWINGS

FIGS. 2, 2A and 2B comprise block schematic diagram of the dual-array buffer circuit according to the present invention;

DESCRIPTION OF THE PREFERRED EMBODIMENT

Figure 1C:
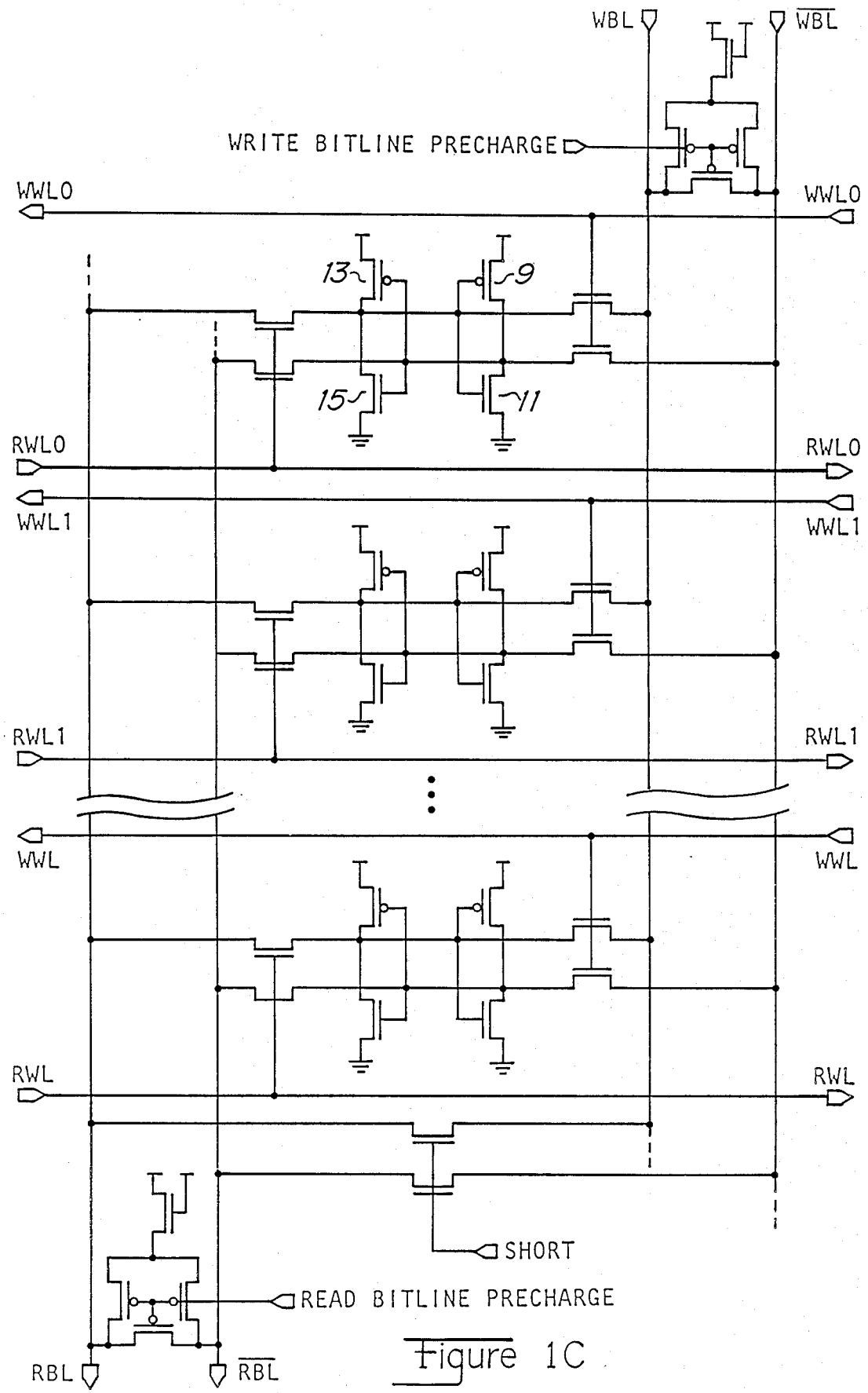
FIGS. 1(a), (b) and (c) are schematic diagrams of data memory cell circuitry according to the present invention.

Referring now to the schematic diagram of FIG. 1(a), there is shown a dual-port Random Access Memory (RAM) cell having pairs of complementary MOS transistors 9, 11 and 13, 15 cross coupled to form a bistable memory cell with separate pairs of write bit lines (WBL and WBL) and read bit lines (RBL and RBL) and individual word lines (WWL and RWL). A matrix array of such cells may be assembled in specific rows and columns with all of the word lines of the cells in a common row of the matrix coupled together and with all the bit lines of such cells in a common column coupled together. In this manner, when a particular row is selected, the word line in that row is raised in potential to provide access to the memory cells in that row, and the data in the cells along such accessed row can be accessed on the bit lines of the cell in a selected column. The word line in a selected row is raised once while the individual columns are bieng accessed.

Because each cell has two word lines and two pairs of bit lines associated with it, the connection of such cells in a matrix array permits two independent schemes of accessing an individual cell since two sets of row and column control lines are provided. One set of row and column control lines is used exclusively for writing data to individual cells, and another set of row and column control lines is used for reading the data contained in individual cells. Thus, read and write operations may proceed independently and asynchronously.

Specifically, when a row is selected either for reading or writing, all cells along that row become electrically connected to their corresponding bit lines. Data already present in these cells is not disturbed by this operation. The bit lines must be initialized (prior to this access) to a high voltage with no differential voltage present between pairs of bit lines. This is referred to as equilibration or precharging. In accordance with the present inventions, while a particular row is being accessed in one array, the corresponding bit lines in the other array are being precharged. Thus, as data is sequentially accessed along the one row and as the end of that row is reached, an immediate access can then occur to any row within the second array since the bit lines in that array will already have been initialied. Similarly, as data access proceeds along the selected row in the second array, the bit lines in the first array are precharged, thus making the cells in the first array available for immediate access when the end of the selected row in the second array is reached. In this way, by alternating rows between the two arrays, continuous rapid access can occur without having to wait for initialization time between accesses. This technique of alternating row access (with requisite precharging occurring in a previous interval) takes place separately and independently for both read accesses and write accesses.

Figure 2A:
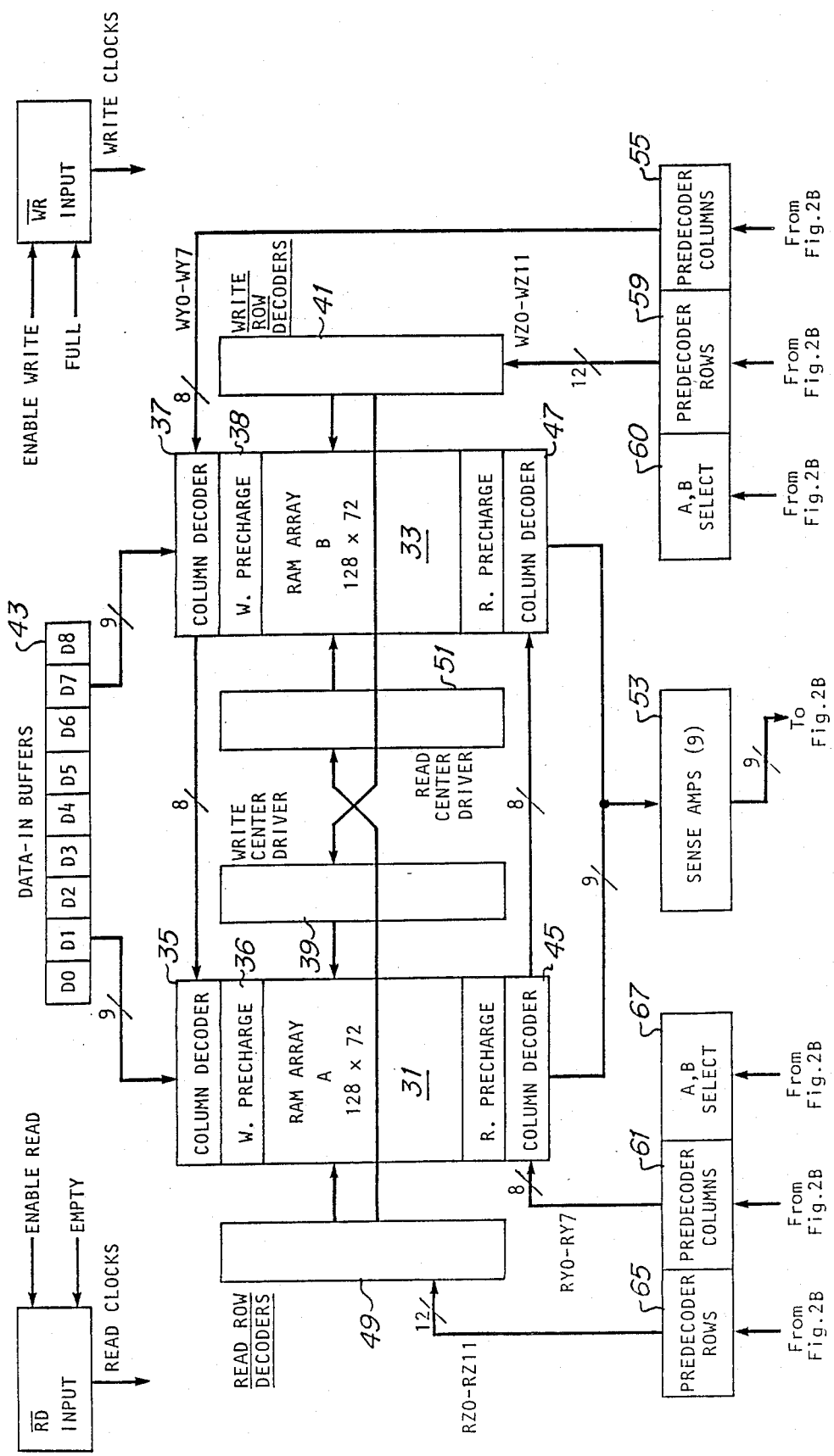
Figure 2B:
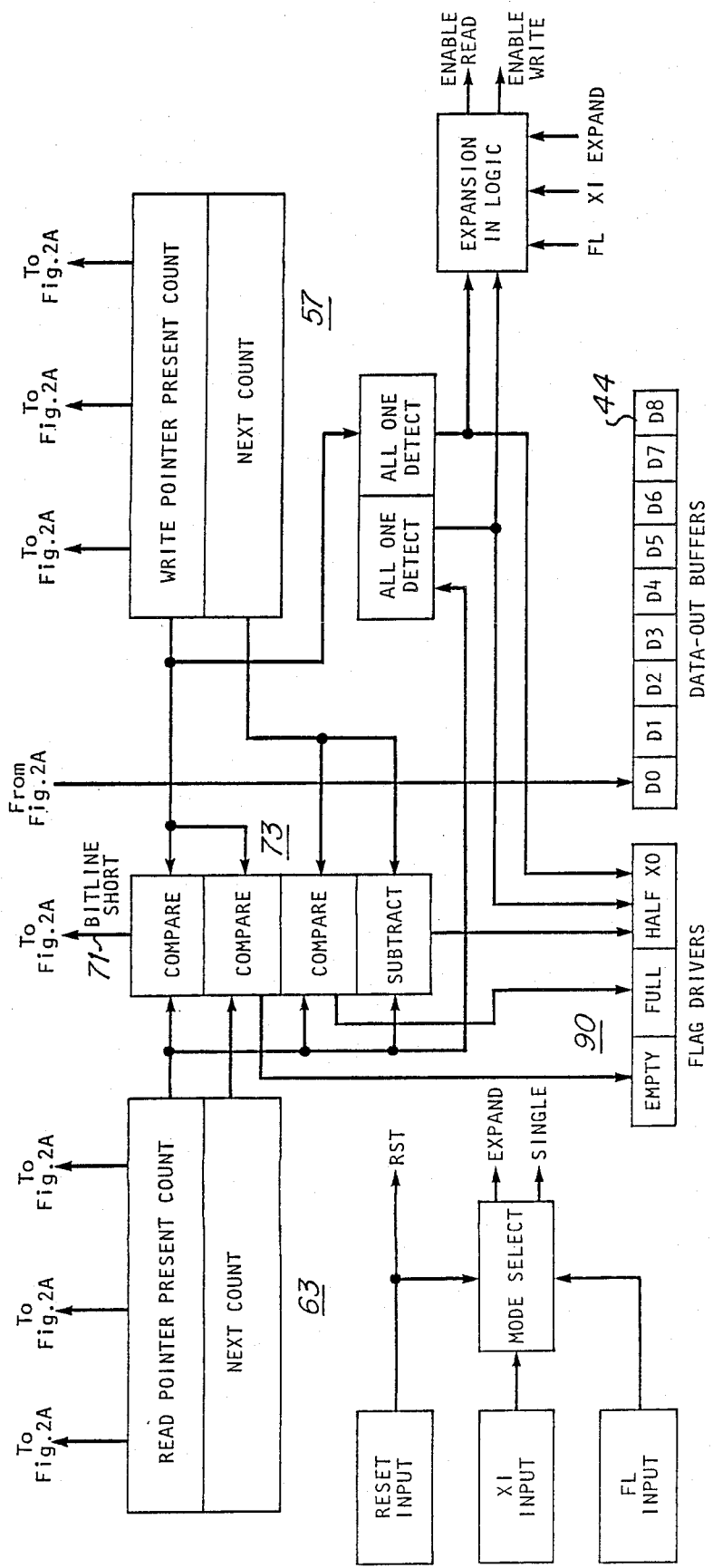

Referring now to FIGS. 2A and 2B, there is shown a block schematic diagram of a pair of RAM arrays 31, 33, each comprising a plurality of individual memory cells of the type illustrated and described above with reference to FIGS. 1A and 1B. Each of these arrays may be configured to store data in a matrix of rows and columsn that is several columns long and several rows deep (e.g., $72 \times 128$). The columns and rows of memory cells in each array are connected to decoders for writing and reading data into and out of selected memory cells in the arrays. Specifically, the write column decoders 35, 37 are connected to the dual arrays to address selected columns of memory cells, and the write row decoders and drivers 39, 41 are connected to the dual arrays to address selected rows of memory cells. Similarly, the read column decoders 45, 47 are connected to the dual arrays to address selected columns of memory cells, and the read row decoders and drivers 49, 51 are connected to the dual arrays to address selected rows. Each of the read and write row decoders includes driver circuitry that is repeated, as shown in the center of the dual arrays, so that the common row decoder supplies the same information to driver circuits for each of the dual arrays. The data-in buffer 43 includes one byte of storage plus an additional bit for use as a parity or control bit, and is connected to the write column decoders 35, 37. Similarly, the data-out buffer 44 includes one byte of storage plus the additional parity or control bit, and is connected via sense amplifier 53 to receive the output of the read column decoders 45, 47.

In general, while one array is being accessed, the other array is being precharged (i.e., elevating the logic state of bit lines and settling transient signals) in preparation for the next access from such other array. Therefore, precharging times for one array overlap the time for performing read or write operation in the other array, and therefore do not limit operating speed. Also, the precharging can be done mroe slowly with lower peak current requirements since such operations are not performed in periods of time that affect operating speed.

In operation, the data-in buffer 43 passes data which is to be entered or written into the RAM arrays 31, 33 and which is designated for storage in selected 9-column segments of the arrays. The column address information is supplied by the column pre-decoders 55 which, in turn, is supplied by write pointer counters 57. The columns thus addressed may extend over both arrays (e.g., 144 columns) where each column is uniquely addressable. Data in the arrays is accessed sequentially by columns, and arrays alternate when the boundary of column addresses for a given array is reached. The decoded word line in the next array is immediately raised by the row decoders or center drivers 39, 41, 49, 51 when the last column in the present array is read (or written to). Therefore, signal is developed on the bit lines in the next array during the time between cycles. In addition, the data from the data-in buffer 43 is also designated for storage in selected rows of the arrays by the row address information supplied by the row predecoders 59 which, in turn, is supplied by the write pointer counters 57.

Similarly, the data which is to be read out from the RAM arrays 31, 33 is designated in selected 9-column segments by the column predecoders 61 which, in turn, is selected by the read pointer counters 63. The columns thus addressed may extend over both arrays, where each column is uniquely addressable, and the arrays alternate when the boundary of column addresses for a given array is reached, as previously described.

In addition, the data which is to be read out from the RAM arrays is also designated by the row predecoders 65 which, in turn, is selected by the read pointer counters 63. The write operations in RAM arrays 31, 33 are alternated by the array selector 60 which alternatively selects the rows in one or the other of the arrays 31, 33. The read operations from the RAM arrays are alternated by the array selector 67 which alternately selects the columns in one or the other of the arrays 31, 33. Thus, because the row addresses in both arrays are addressed independently, one array may be operated in the write mode on 9-bits of data in the buffer register 43 while the other array is operated in the read mode to read addressed data into the buffer register 44, or vice versa. Or, successive data words in buffer 43 may be alternately written into the arrays 31, 33 with no simultaneous read operation occurring in the alternate array. Also, successive read operations may occur alternately in the arrays with no simultaneous write operation occurring in the alternate array. Or, reading and writing can occur simultaneously in the same array. When read and write operations are required to occur simultaneously from the same row of memory cells within the same array, the bit-line short-control output 71 from comparators 73, as later described herein, shorts together the read and write bit lines of the selected memory cells by column through transistor shorting devices, as shown in FIG. 1B, so that both read and write ports are accessed at the same time. A write operation is therefore done both to the cells in the row and directly to the read bit lines, bypassing the cells. Thus, potential problems with read pushout or write failure are eliminated. Data does not have to be cycled through, for example, from an input register at the top to an output register, for example, at the bottom, but rather may remain in row locations where written in until read out.

The row and column location in the arrays 31, 33 at which data is accessed is controlled by the counters which, in one embodiment of the invention may be binary counters, or the like, which have an extended counting range that is double the number of address locations in the array to be accessed. In this manner, read and write pointers for designating the locations in which access for read or write operations take place are generated independently, and the read and write operations proceed independently. The full or empty status of the arrays (i.e., write minus read as an indication of storage in use) is therefore determined by the relationship of read and write pointers, and this status information is usually important for external circuitry preceeding and following the FIFO in the data stream.

Figure 3:
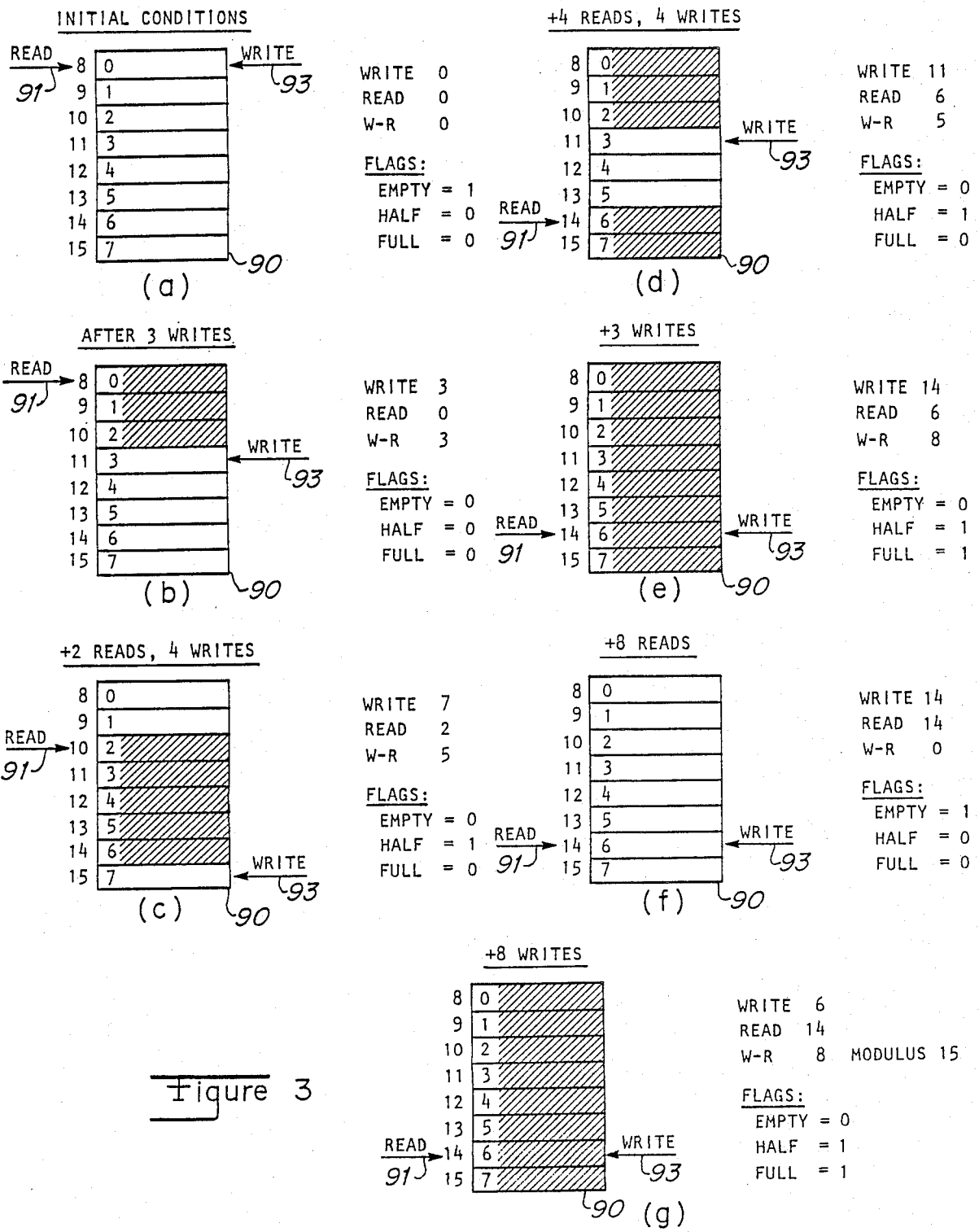
FIGS. 3 (a–g) are simplified diagrams of addressable memory cells according to the present invention.

With reference to FIGS. 3(a), (b), (c), (d), (e), (f), and (g), there are shown simplified diagrams of one example of random-access cells 90 of data-storage locations, each having an address that is doubly numbered. Therefore, with reference to the initial conditions illustrated in FIG. 3(a), read and write pointers 91, 93 both identify the initial address '0'. The write pointer 93 is '0', the read pointer 91 is '0' and write minus read (W-R)=0. The status therefore is empty='1', half (full)='0', and full ='0'.

After 3 write operations, as illustrated in FIG. 3(b), the read pointer is at address 0, the write pointer is at address 3 and W−R=3. The status of the array is therefore Empty='0', Half='0', and Full='0'. After two read operations and four additional write operations, as illustrated in FIG. 3(c) the read pointer 91 is 2, the write pointer is at 7, and W−R is 3. The status is therefore Empty ='0', Half='1', and Full='0'. Further, after four additional reads and four additional writes, as illustrated in FIG. 3(d), the read pointer 91 is at 6 and the write pointer 93 is at 11, and W-R is 5. The status therefore is Empty='0', Half='1', and Full='0'. After three additional writes, as illustrated in FIG. 3(e), the read ponter 91 is at 6, the write pointer 93 is at 14, and W-R is 8. Therefore, the status is Empty='0', Half='1', and Full='1'. After eight additional reads, as illustrated in FIG. 3(f), the read pointer is at 14, the write pointer 92 is at 14, and W-R=0. Therefore, the status is Empty='1', Half='0', and Full='0'. After eight additional writes, as illustrated in FIG. 3(g), the read pointer is at 14, the write pointer is at 6 and W−R=8 in modular arithmetic. Therefore the status is once again Empty='0', Half='1'and Full='1'.

The status of the memory array is determined according to the present invention, as illustrated in the foregoing examples, by the logic conditions that Empty occurs when read pointer address =write pointer address, and Half occurs when the next-to-most significant bit (MSB-1) of the difference between the read pointer address and the write pointer address (1's complement) is logically AND-combined with Not Empty (or $\overline{\text{EMPTY}}$). The Full status is generated when the most-sigificant bit of the read pointer is not equal to the most-sigificant bit of the write pointer, and all other bits are the same. Status flags generated in this manner according to the present invention are therefore valid no matter how or in what sequence of read and write operations the particular counts are attained. It should be noted that the most sigificant bits of the pointer addresses are used for the full/empty logic, but are not used for addressing accessable memory locations.

The present and next-count counters 63 for controlling the read pointer, and the present and next-count counters 57 for controlling the write pointer, as illustrated in FIG. 2B, may include conventional counter circuits with additional registers to provide outputs designating the next counts as well as the present count. The next count is updated at the beginning of an access cycle, while the present count is updated at the end of an access. These countes 57, 63 are connected to the row and column predecoders and decoders as previously described and are also connected to the comparators and subtraction (or, 1's complement) circuits 73 to produce the above-described status information.

Figure 4:
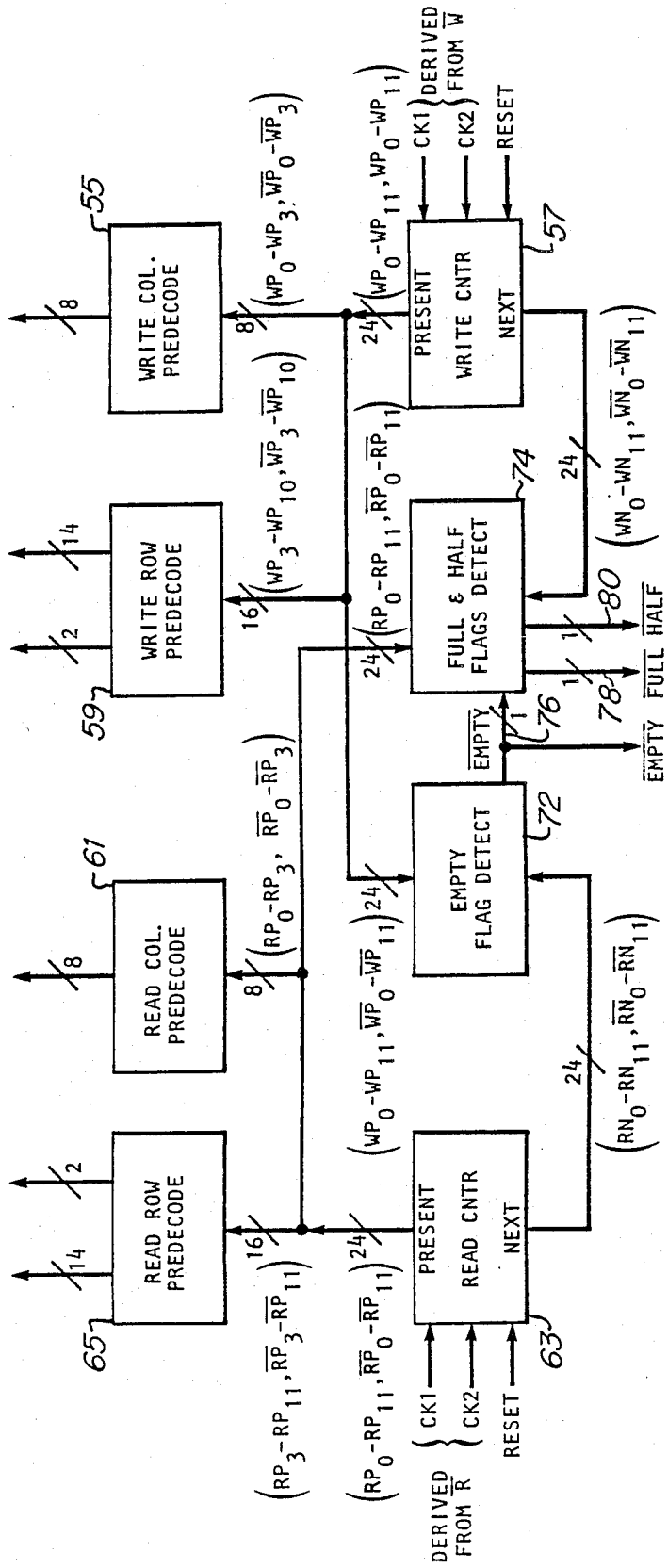
FIG. 4 is a schematic block diagram of the read and write pointer status logic circuitry.

More specifically, in accordance with the embodiment of the present invention illustrated in the block schematic diagram of FIG. 4, there is shown the write counter 57 and the read counter 63, each having present and next-count outputs. The present-count output of the write counter 57 is applied to the write-row and write-column predecoders 55, 59, and the present-count output of the read counter 63 is applied to the read-row and read-column predecoders, 61, 65, as previoulsy described with reference to FIG. 2. In addition, an Empty-flag detector 72 is connected to receive the next count of the read counter 63 and the present count of the write counter 57 to produce the Not Empty output 76 in response to the logical combination (i.e., read pointer=write pointer) previously described. In addition, Full and Half flags detector 74 is connected to receive the present count of the read counter 63 and the next count of the write counter 57 to produce the Full and Half outputs 78, 80 in accordance with the logical combination previously described. These status indicators are supplied to the flag drivers 90 for providing output indications of the operating status of the arrays 31, 33.

Figure 5:
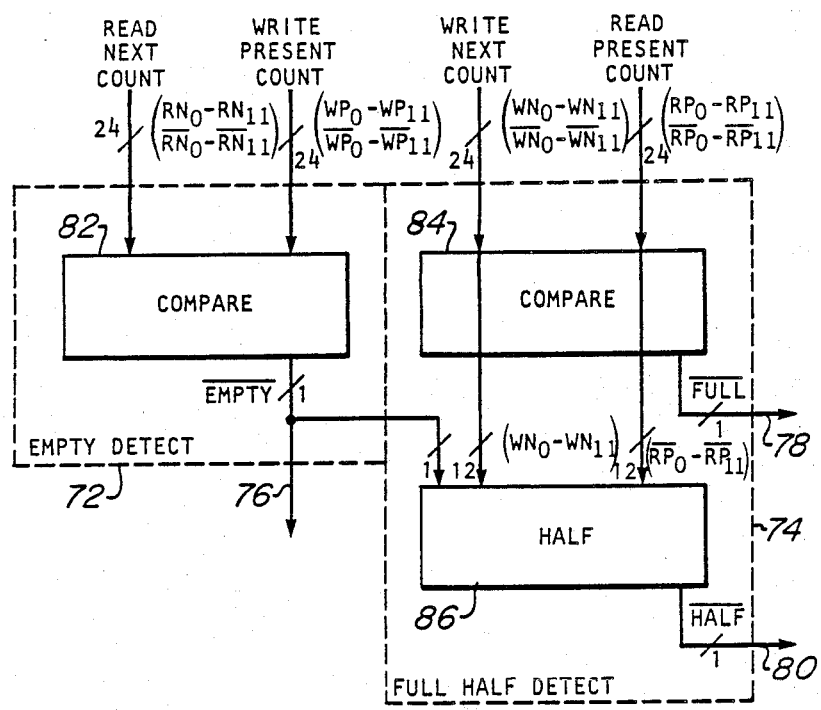
FIG. 5 is a schematic block diagram of the flag detector circuits.

Referring now to FIG. 5, there is shown a block schematic diagram of the logic circuitry of FIG. 4 in which the comparator 82 of the Empty detector 72 is shown connected to receive the read next-count and write present-count for producing the Not Empty output 76. Similarly, FIG. 5 illustrates that the comparator 84 of Full/Half detector 74 is connected to receive the write next-count and read present-count to produce the Not Full output 78, as previously described. Also, this detector 72 includes a subtractor 86 which also receives the write next-count and read present-count to produce the Not Half output 80, as previously described.

Figure 6:
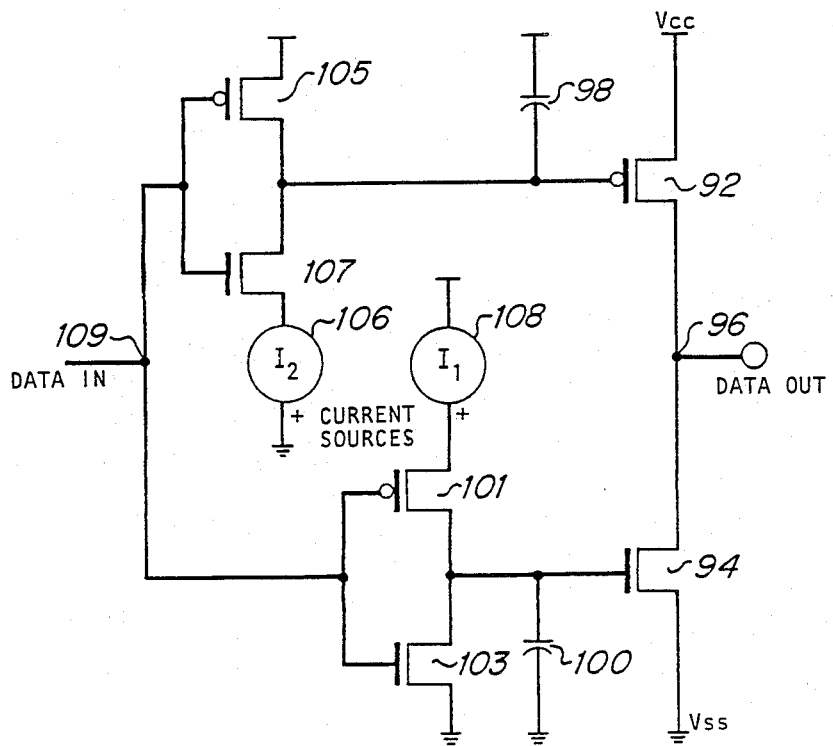
FIG. 6 is a schematic block diagram of the data driver circuitry of the present invention.

Referring now to FIG. 6, there is shown a schematic diagram of data output driver circuitry according to the present invention for use in the flag drivers 90, and Data-Out buffers 44. A pair of Complementary Metal-Oxide Silicon (CMOS) field-elect devices 92, 94 are serially connected between the terminals of the bias supply, with the output 96 derived from signal at the common connection of the devices. The gate electrode of each device includes a capacitor 98, 100 connected thereto to control the rise itme of the data signals supplied thereto. In certain applications, it is frequently desirable to reduce the rate of rise of signal current at the output of the driver circuit, for example, to reduce noise attributable high dI/dt current pulses, and to provide relatively temperature-regulated performance over a range of operating temperature, as well as to maintain compatibility with the data-signal handling ability of external circuitry. For contemporary CMOS devices operating in the saturation mode, drain current departs from the theoretical square law function of gate voltage, and instead, approaches a substantially linear relationship, as is commonly known. Noise is developed through parasitic inductance in the device (and its package) and through the rate of change of current according to the relation $\Delta V = L di/dt$, where $\Delta V$ is the noise voltage, L is the inductance, and di/dt is the rate of change of current. Making use of the previously-described property of these devices, it is clear that di/dt, and therefore noise, may be controlled by controlling the rate of change of gate voltage on the driver transistor. This is done by driving the gate from a linear voltage ramp generated by the current source 106 or 108 charging the capacitor 98 or 100. Transistors 101, 107 act as switches to connect the current sources 106, 108 to the respective capacitors 98, 100, and transistor 103, 105 serve to discharge the respective capacitors 98, 100 not being charged. The transistors 92 and 94 are thus alternatively driven or turned off according to the sense of data-in signal 109. It should be noted that the rate of change of gate voltage, and therefore also the noise level, is set by the value of the current source and the capacitor it charges. By changing the value of either of these components, the noise level may be adjusted independently of other circuit characteristics. In the illustrated embodiment, each of the current sources 106, 108 may be realized by a transistor operating in saturation, with its current set by a voltage source connected to its gate. This voltage source (and therefore also the current source) may be temperature-regulated and may be varied in known manner to control noise levels.

Thus, applied data-in signals 109 are capable of turning on one of the CMOS devices 101, 103 and 105, 107 to permit current to flow 106, 108 into the corresponding capacitor 98, 100 that is coupled to the gate electrode of the output device 92, 94. The rate of current flow from the current sources 106, 108 may be controlled in conventional manner, as previously described, within a given range of values. The rate of change of signal at the output 96 on applied data-in signals 109 is thus controlled by the settings of the current sources 106, 108. The capacitors 98,100 are rapidly discharged through the corresponding other CMOS devices 103, 105 which are connected to conduct when the associated CMOS devices 101, 107 are in the cut-off condition on the applied data-in signals 109.

We claim:

1. A method of operating a plurality of arrays for dual-ported randomly-accessable memory cells having read and write word lines and read and write bit lines per memory cell to which a data signal is written and from which a data signal is read by precharging of bit lines during an interval, and in response to control signal applied to a word line thereof during another interval, where the memory cells have the associated write word lines and the read word lines arranged in consecutive rows and have the associated read bit lines and the write bit lines arranged in columns in each array, the method comprising the steps of:

applying wirte word line control signals to all of the memory cells arranged in a selected row in one of the arrays during one write interval;

precharging during said one write interval the write bit lines of the memory cells arranged in another of the arrays while control signal for said write word llines is absent from all of the memory cells in said another array;

writing data signals to the memory cells arranged in selected columns within said one array along the selected row by accessing a number of the columns of memory cells in said one array during said one write interval for writing data signal therein;

applying write word line control signals to all of the memory cells arranged in a selected row in said another of the arrays during another write interval;

precharging during said another write interval the write bit lines of the memory cells arranged in said one of the arrays while control signal for the write word lines is absent from all of the memory cells in said one of the arrays;

writing data signals to the memory cells arranged in selected columns within said another array along the selected row by accessing a number of the columns of memory cells in said another array during said another write interval for writing data signals therein;

applying read word line control signals to all of the memory cells arranged in a selected row in said one of the arrays during one read interval that is independent of said one and said another write intervals;

precharging during said one read interval the read bit lines of the memory cells arranged in another of the arrays while control signal for said read word lines is absent from all of the memory cells in said another array;

reading data signals from the memory cells arranged in selected columns within said one array along the selected row by accessing a number of the columns of memory cells in said one array during said one read interval for reading data signals therein;

applying said read word line control signals to all of the memory cells arranged in a selected row in said another of the arrays during another read interval that is independent of said one and said another write intervals;

precharging during said another read interval the read bit lines of the memory cells arranged in said one of the arrays while control signal for said read word lines is absent from all of the memory cells in said one of the arrays; and reading data signals from the memory cells arranged in selected columns within said another array along the selected row by accessing a number of the columns of memory cells in said another array during said another read interval for reading the data signals therein.

2. The method according to claim 1 wherein a control signal is applied to the read word line of a selected row of memory cells in an array for the duration of a plural number of consecutive read data access intervals for memory cells along the selected row.

3. The method according to claim 1 wherein a control signal is applied to the write word line of a selected row of memory cells in an array for the duration of a plural number of consecutive write data access intervals for memory cells along the selected row.

4. The method according to claim 1 comprising the steps of:

detecting the reading and the writing of data signals substantially simultaneously from memory cells along a selected row in an array; and in response thereto, connecting the read bit lines to the corresponding write bit lines of each memory cell along the selected row.

* * * * *